United States Patent
Gross

(10) Patent No.: US 7,162,669 B2
(45) Date of Patent: Jan. 9, 2007

(54) APPARATUS AND METHOD FOR COMPRESSING REDUNDANCY INFORMATION FOR EMBEDDED MEMORIES, INCLUDING CACHE MEMORIES, OF INTEGRATED CIRCUITS

(75) Inventor: Fred Gross, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 428 days.

(21) Appl. No.: 10/458,474

(22) Filed: Jun. 10, 2003

(65) Prior Publication Data

US 2004/0255209 A1    Dec. 16, 2004

(51) Int. Cl.
*G11C 29/00* (2006.01)

(52) U.S. Cl. .................. 714/710; 714/7; 714/25; 714/723; 365/201

(58) Field of Classification Search .............. None
See application file for complete search history.

(56) References Cited

U.S. PATENT DOCUMENTS

| | | | |
|---|---|---|---|
| 6,768,694 B1* | 7/2004 | Anand et al. ........... 365/225.7 |
| 6,842,874 B1* | 1/2005 | Voshell .................. 714/723 |
| 2001/0028588 A1* | 10/2001 | Yamada et al. .......... 365/210 |
| 2004/0153900 A1* | 8/2004 | Adams et al. ........... 714/710 |
| 2005/0030822 A1* | 2/2005 | Beer .................... 365/232 |

OTHER PUBLICATIONS

Mazumder et al., "A Novel Built-In Self-Repair Approach to VLSI Memory Yield Enhancement", IEEE International Test Conference 1990, pp. 833-841.*
Cowan et al., "On-Chip Repair and an ATE Independent Fusing Methodology", IEEE International Test Conference 2002, Oct. 7-10, 2002, pp. 178-186.*
Ouellette et al., "Shared Fuse Macros for Multiple Embedded Memory Devices with Redundancy", IEEE Conference on Custom Integrated Circuits, May 6-9, 2001, pp. 191-194.*
Handy, "The Cache Memory Book", Academic Press, Second Edition, pp. xii-xiii, 14-23, 46-47, 54-57, 60-65, 74-75.*

* cited by examiner

*Primary Examiner*—Albert Decady
*Assistant Examiner*—John P. Trimmings

(57) ABSTRACT

An embedded memory on an integrated circuit has a memory cell array equipped with replacement cells and mapping logic for electronically substituting the replacement cells for defective cells at at least one location in the memory cell array. The memory also has programmable links for storing redundancy information in a compressed format, and decoding logic for decompressing the redundancy information and controlling the mapping logic.

3 Claims, 3 Drawing Sheets

APPARATUS AND METHOD FOR COMPRESSING REDUNDANCY INFORMATION FOR EMBEDDED MEMORIES, INCLUDING CACHE MEMORIES, OF INTEGRATED CIRCUITS

FIELD

The present document relates to the field of monolithic semiconductor storage devices having redundancy. In particular, the document relates to compression of redundancy control information in embedded memories, including cache memories, such as are commonly found on processor and other logical integrated circuits.

BACKGROUND

Many available integrated circuits contain large memory arrays. During manufacture of integrated circuits, defects can arise in such memory arrays. It is known that many of these defects, known as "point defects," prevent function of only a small number of cells. Many other defects, such as row or column defects, can arise in memory arrays and will prevent operation of cells in a particular column or row of the large memory array while permitting operation of other cells in the design.

Memory arrays included in integrated circuits with substantial non-memory function are known herein as embedded memory arrays. Embedded memory arrays include cache memory, such as is often found in processor integrated circuits.

Integrated circuits having unrepaired and/or unbypassed defects in embedded memory arrays are typically of no value in the marketplace. It is desirable to repair and/or bypass defects in embedded memory arrays to improve yield and reduce costs of functional circuits. The larger the percentage of die area occupied by memory arrays, the more likely the array is to have defects.

Many memory arrays available in integrated circuits are equipped with a replacement group of cells intended to be electronically substituted for defective cells in the array; thereby repairing defects in the arrays. These replacement cells may take the form of additional cell rows in an array; these cell rows are accessed in place of rows having defective cells. Replacement cells may also take the form of extra columns in an array; data from these columns is substituted for data from defective columns. Block-organized memories may have entire replacement blocks, where an entire block of defective memory can be substituted with good memory. Replacement cells may also be organized as a small memory having mapping logic for substituting cells of the small memory for defective cells in a larger array. Provision of replacement cells in a memory system is known to significantly improve memory yield, thereby reducing production cost, despite a small die size increase.

With all these techniques, replacement cells must be variably mapped onto the larger memory array of the embedded memory. This mapping requires storage of replacement-cell, column, row, or block mapping information within the integrated circuit. This required replacement-cell, column, row, or block, mapping information is known herein as redundancy information.

It is known that memory defects may be "hard" defects, where cells fail to function under all conditions. Other defects may be speed or temperature related, where cells fail to function only under certain operating conditions. It is therefore desirable to store redundancy information in non-volatile form within the integrated circuit rather than deriving this information from self-test results at system boot time.

Most integrated circuit processes used for construction of static or dynamic random access memory (SRAM or DRAM) embedded memory arrays do not allow for fabrication of EEPROM or UV-EPROM cells for storage of redundancy information. Storage of redundancy information in nonvolatile form within integrated circuits made on these processes has been accomplished with laser-programmed or fusible link technologies; both types are herein known as programmable links. Laser-programmed links require large die area such that a production machine can locate and program selected links since laser spot size is large compared with line widths obtainable on modern submicron fabrication processes. Fusible-links also require substantial die area for each fusible link, since each link requires associated passivation openings, high-current drivers for fusing the link, and other associated components.

It is therefore desirable to minimize the number of programmable links required to store redundancy information on an integrated circuit.

Many integrated circuits, including processor integrated circuits, contain multiple embedded memory arrays of size sufficiently large that die yields can be improved by providing redundant cells, mapping hardware, and programmable links.

It is common that embedded arrays are organized with a number of columns that is not a power of two. In particular, modern processors often incorporate multiple levels of cache memory, where each cache memory has separate embedded memory arrays for data and for cache tag information. Cache tag information memory arrays are often organized as memory having word length that is not a power of two. Recent processor designs often implement error correction coding (ECC) for cache data memory to protect against soft errors; adding ECC to a memory having word length equal to a power of two generally results in a memory having an internal word length that is not a power of two.

SUMMARY

An embedded memory on an integrated circuit is equipped with replacement cells and has redundancy information for controlling substitution of the replacement cells for defective cells in the embedded memory.

The redundancy information is stored within the integrated circuit in compressed form. On-chip decompression logic is provided to decompress the redundancy information so that substitution of replacement cells for defective cells can take place automatically on the integrated circuit.

In a particular embodiment, the embedded memory serves as a portion of a cache memory array within a processor integrated circuit.

DETAILED DESCRIPTION OF THE EMBODIMENTS

Figure 1:
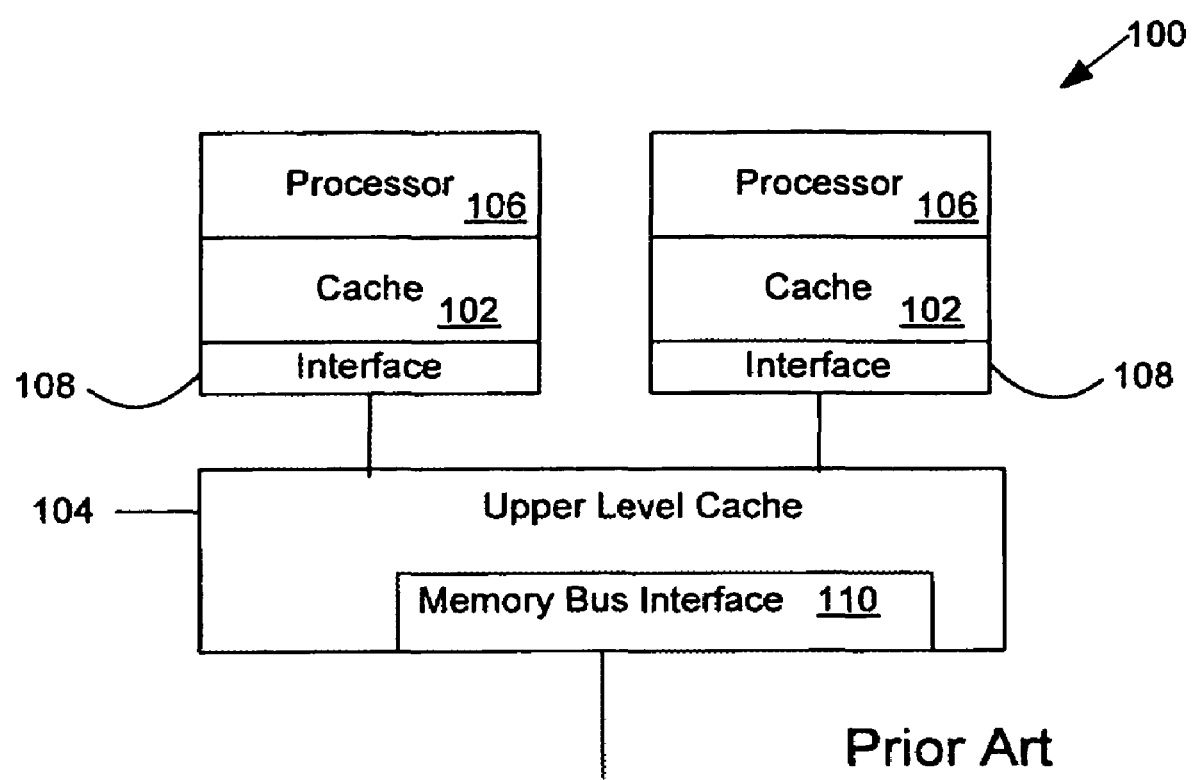
FIG. 1 is an abbreviated, exemplary, block diagram of a processor integrated circuit having embedded memories serving as cache.

FIG. 1 is a block diagram of a modern processor integrated circuit 100 having embedded cache memories 102, 104. Integrated circuit 100 has one or more processors 106, each connected to first level instruction and data caches 102. First level caches 102 may implement separate instruction and data caches, or may implement combined instruction-data cache. Memory references that miss in first level caches 102 are passed by interfaces 108 to second level combined instruction-and-data cache 104. Memory references that hit in second level cache 104 are passed on to a memory bus interface 110, and passed to higher-level memory. There may be a third, sometimes even a fourth, level cache in the system; processor integrated circuits 100 are known that implement a third level cache on the processor integrated circuit 100. Processor integrated circuits 100 are known where the cache memory arrays, such as cache memories 102, 104, are a substantial fraction—sometimes as much as three quarters—of total active die area. Manufacturing yield of these large and expensive processor integrated circuits is improved if these memories are equipped with replacement cells electrically mapable to replace defective cells of the array.

Figure 2:
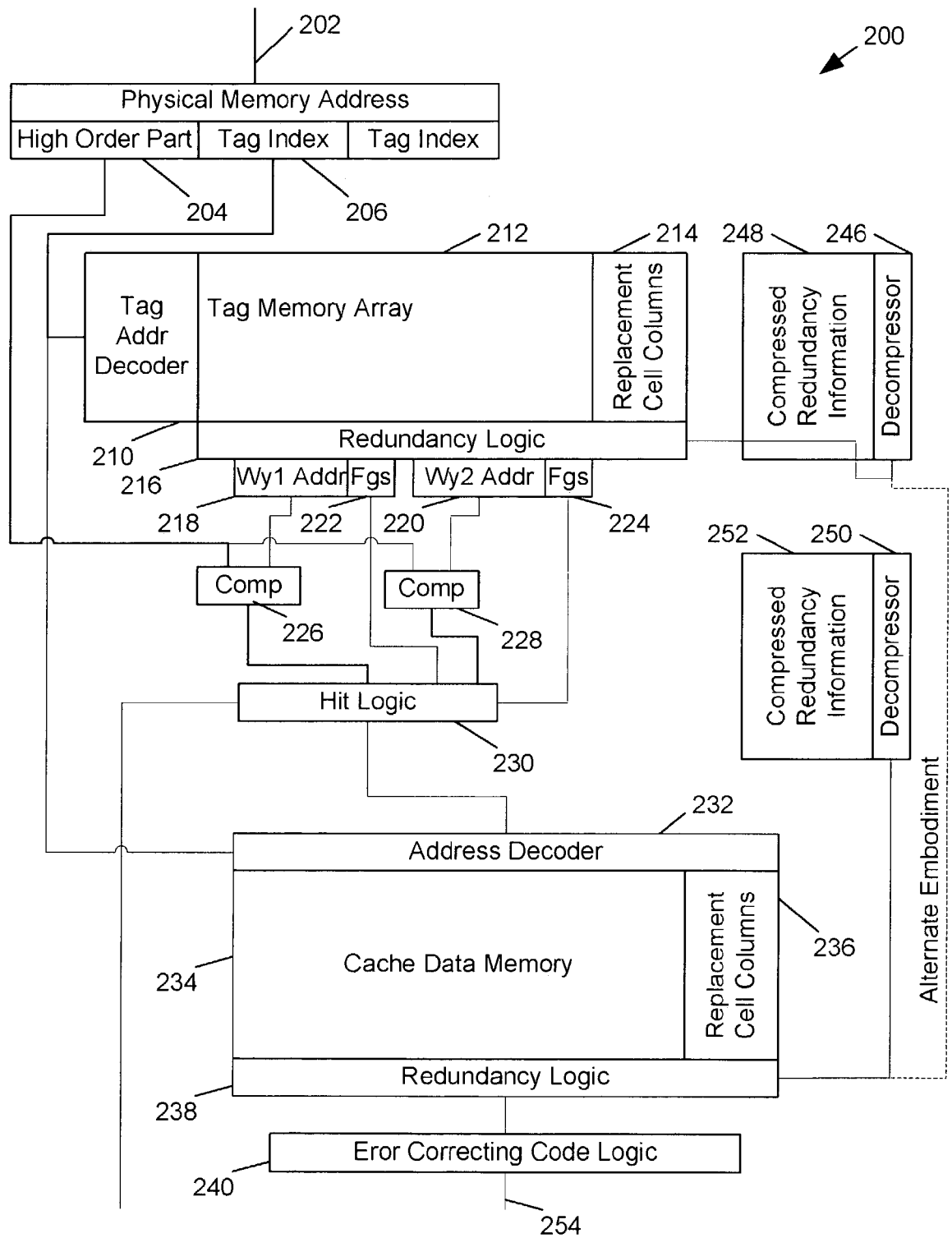
FIG. 2 is an abbreviated, exemplary, block diagram of a cache memory having redundancy information, showing data and tag memories, redundancy information storage, and decompression logic.

FIG. 2 illustrates read pathways of an improved multiple-way cache memory system 200, such as may be embodied in embedded first and higher level cache memories 102 and 104 of a processor integrated circuit 100. An address 202 is broken into a higher address part 204 and a tag address part 206. There may be additional address parts such as an address of a memory word in a cache line. The tag address part 206 is passed to a tag address decoder 210, which addresses a tag memory array 212 and any replacement-cell columns 214 that are provided. Tag memory 212 and replacement-cell columns 214 are read to redundancy logic 216, where defective tag memory 212 columns are replaced with replacement-cell columns 214.

Corrected cache tag information from redundancy logic 216 has multiple fields, including way one address 218, way two address 220, way one flags 222, and way two flags 224. The high address part 204 is compared by comparators 226 and 228 against the way addresses 218, 220. Comparator 226, 228, results and flags 222, 224, are used by hit logic 230 to determine if the address has scored a hit in the cache, and if so, which 'way' of the cache has hit. A cache having multiple ways, as illustrated, is a set-associative cache.

The tag address part 206, and hit logic 230 'way-hit' information, is used by cache data address decoder 232 to address cache data memory 234 and replacement-cell columns 236. Data read from cache data memory 234 and replacement-cell columns 236 is read through redundancy logic 238 where data from hard-failed columns of cache data memory 234 are replaced with data from replacement-cell columns 236. Data from redundancy logic 238 is then corrected for soft errors in error-correcting code logic 240.

Tag memory redundancy logic 216 is controlled by decompressed redundancy information provided by decompressor 246 from compressed redundancy information 248 stored in programmable links on the integrated circuit. Similarly, cache memory redundancy logic 238 is controlled by decompressed redundancy information provided by decompressor 250 from compressed redundancy information 252 stored in programmable links.

Consider a processor integrated circuit where the word length of corrected data 254 from error-correcting code logic 240 is sixty-four bits; data from redundancy logic 238 is, in this embodiment seventy-two bits wide. Seven bits are therefore required to control which column is replaced by each column of replacement columns 236. A disable code or a disable bit may be used to indicate that a particular column of replacement cells is unused. Assume that there are two replacement columns. Uncompressed redundancy information therefore requires fourteen to sixteen bits. The total number of possible combinations of replacement-cell column programming is therefore seventy-one squared plus seventy-three (with enable information), since it is not necessary to replace any one column with both replacement cell columns. This is only five thousand one hundred fourteen combinations which can be encoded in compressed form in thirteen bits. Similarly, if four replacement-cell columns are provided, uncompressed redundancy information requires thirty-two bits, while this information can be represented in compressed form in twenty-three bits. Similarly, the width of tag memory 212 is unlikely to be a power of two, and is therefore subject to potential compression.

In an alternative embodiment, the word length of corrected data 254 from error-correcting code logic 240 is thirty-two bits; while data from redundancy logic 238 is thirty-eight bits wide. Six bits are required for the direct substitution of each replacement-cell column; therefore two replacement columns would require twelve redundancy bits. This information can be encoded in compressed form using ten bits.

The width of corrected data, and width of tag memories, expressed herein are by way of example only. It is expected that the invention is applicable to memories of different widths, so long as memory width is not an exact power of two.

Since the compression efficiency increases with the number of fields of redundancy information compressed, in an alternative embodiment decompressor 250 and compressed redundancy information 252 are deleted. In this embodiment, redundancy logic 238 is controlled by additional fields of decompressed redundancy information provided by decompressor 246 from compressed redundancy information 248 stored in programmable links.

In a particular embodiment of the processor integrated circuit having two columns of replacement cells 236 associated with cache data memory 234, the compressed redundancy information 252 is encoded according to the formula:

$$\text{encoded} = -(\text{red0} \ast \text{red0})/2 + (2 \ast \text{io\_bits} + 3) \ast \text{red0}/2 + \text{red1} - \text{red0}$$

where:
encoded=is the encoded redundancy information,
red0=the column at which the first replacement cell column is substituted into the array, and
red1=the column at which the second replacement cell column is substituted into the array, and red0 is less than red1.

In an alternative embodiment having three replacement columns, the redundancy information is encoded according to the formula:

$$\text{encoded} = -\text{red1} \ast \text{red1}/2 + (2 \ast \text{io\_bits} + 3) \ast \text{red0}/2 + \text{red2} - \text{red1} + (\text{red0} \ast \text{red0}/3 - (\text{io\_bits} + 1) \ast \text{red0} + 2/3 + (\text{io\_bits} + 2) \ast \text{io\_bits}) \ast \text{red0}/2$$

where:
encoded=is the encoded redundancy information,
red0=the column at which the first replacement cell column is substituted into the array,
red1=the column at which the second replacement cell column is substituted into the array, and
red2=the column at which the third replacement cell column is substituted into the array.

Figure 3:
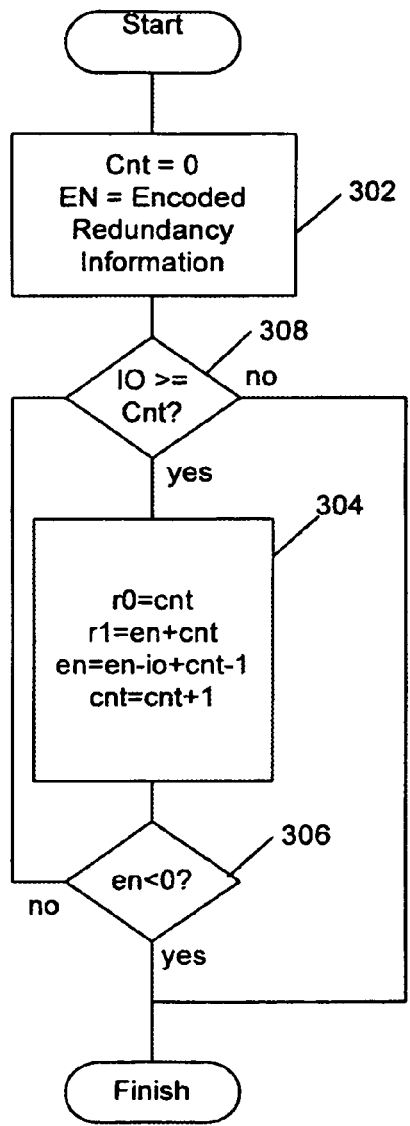
FIG. 3 is a flowchart of a decompressor for compressed redundancy information.

Redundancy information encoded according to this formula can be decoded by a digital state machine executing according to the exemplary flowchart of FIG. 3. In one embodiment, this state machine is implemented in firmware executed at boot time of the system. In another embodiment, this state machine is implemented in dedicated hardware. Alternative embodiments also include decoding the compressed redundancy information in logic gates or a programmed logic array (PLA).

In the flowchart of FIG. 3, IO is the number of columns at which the first replacement cell column can be mapped onto the array, cnt is a loop counter initialized 302 to zero, and EN is a variable initially set to the encoded redundancy information. A loop is executed, where for each pass 304 of the loop the following statements are executed:

$r0 = cnt$ $r1 = en + cnt$ $en = en - io + cnt - 1$ $cnt = cnt + 1$

The process ceases when either EN becomes negative 306 or the loop counter cnt 308 passes the number of encoded redundancy bits.

Figure 4:
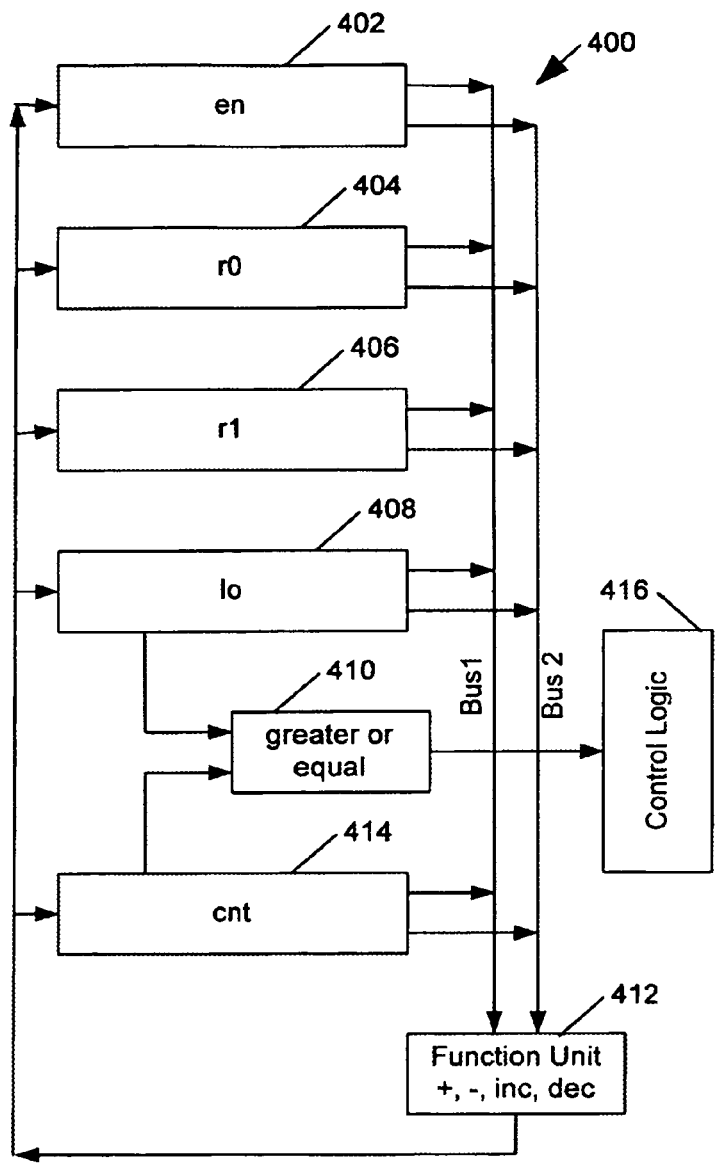
FIG. 4 is an exemplary block diagram of on-chip decompression logic for decompressing redundancy information.

FIG. 4 is an exemplary block diagram of on-chip decompression logic 400 such as may be used for decompressing redundancy information in implementations performing decompression in hardware instead of in firmware on a processor. This logic has four registers, including one initialized with the initial encoded number 402, one for holding a decoded R0 redundancy code value 404, one for holding a decoded R1 redundancy code value 406, and another 408 initialized to the number of columns over which the redundancy codes may position the replacement columns. A comparator 410 and arithmetic-logic unit (ALU) 412 are also provided, as is a loop counter 414 and control logic 416. The on-chip decompression logic 400 executes the method of FIG. 3 upon system boot.

It is anticipated that alternative compression algorithms may be used without departing from the spirit of the invention.

While the foregoing has been particularly shown and described with reference to particular embodiments thereof, it will be understood by those skilled in the art that various other changes in the form and details may be made without departing from the spirit and hereof. It is to be understood that various changes may be made in adapting the description to different embodiments without departing from the broader concepts disclosed herein and comprehended by the claims that follow:

What is claimed is:

1. An embedded memory having compressed redundancy information on an integrated circuit, comprising:
   a memory cell array;
   replacement cells;
   mapping logic coupled to the memory cell array and the replacement cells for electronically substituting the replacement cells for defective cells at at least one location in the memory cell array;
   programmable links for storing compressed redundancy information; and
   decoding logic for decompressing the compressed redundancy information stored in the programmable links and for providing decompressed redundancy information for controlling the mapping logic;
   wherein the embedded memory having compressed redundancy information is a memory of a cache memory subsystem of a processor integrated circuit selected from the group consisting of a tag memory and a data memory; and
   wherein the compressed redundancy information is encoded according to the formula:

$-(red0*red0)/2 + (2*io_{13}bits+3)*red0/2 + red1 - red0$ where:
   red0 is a column at which a first replacement cell column is substituted into the array,
   red1 is a column at which a second replacement cell column is substituted into the array; and
   io_bits is the number of columns at which the first replacement cell column can be substituted into the memory.

2. The embedded memory of claim 1 having compressed redundancy information on an integrated circuit, wherein the integrated circuit comprises at least two memory cell arrays.

3. A processor integrated circuit comprising:
   at least one processor;
   at least one cache memory coupled to the at least one processor to provide instructions thereto, the cache memory comprising:
   a cache tag memory,
   address comparison logic for comparing a portion of address information with information from the cache tag memory,
   hit-detection logic coupled to the address comparison logic for determining cache hits and
   cache data memory for storing instructions to be provided to the processor;
   wherein the cache data memory comprises:
   a memory cell array,
   replacement cells,
   mapping logic for electronically substituting the replacement cells for defective cells at at least one location in the memory cell array;
   programmable links for storing compressed redundancy information; and
   apparatus for decoding compressed redundancy information stored in the programmable links and providing decompressed redundancy information to control the mapping logic; and
   wherein the at least one cache memory also provides data to the at least one processor; and
   wherein the apparatus for decoding compressed redundancy information decodes redundancy information encoded according to the equation:

$-(red0*red0)/2 + (2io_{13}bits+3)*red0/2 + red1 - red0$ where:
   red0 is a column at which a first replacement cell column is substituted into the array,
   red1 is a column at which a second replacement cell column is substituted into the array; and
   io_bits is the number of columns at which the first replacement cell column can be substituted into the memory.

* * * * *

UNITED STATES PATENT AND TRADEMARK OFFICE
CERTIFICATE OF CORRECTION

PATENT NO. : 7,162,669 B2  Page 1 of 1
APPLICATION NO. : 10/458474
DATED : January 9, 2007
INVENTOR(S) : Fred Gross It is certified that error appears in the above-identified patent and that said Letters Patent is hereby corrected as shown below:

In column 6, line 10, in Claim 1,
delete "-(red0*red0)/2+(2*io$_{13}$bits+3)*red0/2+red1-red0" and
insert -- -(red0*red0)/2+(2*io_bits+3)*red0/2+red1-red0 --, therefor.

In column 6, line 54, in Claim 3,
delete "-(red0*red0)/2+(2io$_{13}$bits+3)*red0/2+red1-red0" and
insert -- -(red0*red0)/2+(2*io_bits+3)*red0/2+red1-red0 --, therefor.

Signed and Sealed this

Eighteenth Day of November, 2008

JON W. DUDAS
*Director of the United States Patent and Trademark Office*